United States Patent
Mayer et al.

(10) Patent No.: US 7,998,882 B2
(45) Date of Patent: Aug. 16, 2011

(54) PARTICLE REDUCTION IN PECVD PROCESSES FOR DEPOSITING LOW-K MATERIAL BY USING A PLASMA ASSISTED POST-DEPOSITION STEP

(75) Inventors: Ulrich Mayer, Dresden (DE); Hartmut Ruelke, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 140 days.

(21) Appl. No.: 12/491,849

(22) Filed: Jun. 25, 2009

(65) Prior Publication Data

US 2010/0055899 A1    Mar. 4, 2010

(30) Foreign Application Priority Data

Aug. 29, 2008  (DE) .................. 10 2008 044 987

(51) Int. Cl.
*H01L 21/31* (2006.01)
*H01L 21/469* (2006.01)
(52) U.S. Cl. .......... 438/778; 257/E21.24; 257/E21.241; 438/785; 438/793
(58) Field of Classification Search ............. 257/E21.24, 257/E21.241; 438/778, 785, 793
See application file for complete search history.

(56) References Cited

U.S. PATENT DOCUMENTS

| 7,094,713 | B1 | 8/2006 | Niu et al. .................... 438/795 |
| 2004/0175929 | A1 | 9/2004 | Schmitt et al. .............. 438/628 |
| 2005/0277302 | A1 | 12/2005 | Nguyen et al. .............. 438/463 |
| 2006/0274405 | A1 | 12/2006 | Waldfried et al. ........... 359/359 |
| 2007/0275569 | A1* | 11/2007 | Moghadam et al. ......... 438/781 |
| 2008/0026597 | A1* | 1/2008 | Munro et al. ................ 438/788 |
| 2008/0173984 | A1 | 7/2008 | Lin et al. .................... 257/639 |

FOREIGN PATENT DOCUMENTS

EP   1 077 274 A1   2/2001

OTHER PUBLICATIONS

Translation of Official Communication from German Patent Office for German Patent Application No. 10 2008 044 987.3 dated Apr. 16, 2009.

* cited by examiner

*Primary Examiner* — Asok K Sarkar
(74) *Attorney, Agent, or Firm* — Williams, Morgan & Amerson, P.C.

(57) ABSTRACT

When forming dielectric materials of reduced dielectric constant in sophisticated metallization systems, the creation of defect particles on the dielectric material may be reduced during a plasma enhanced deposition process by inserting an inert plasma step after the actual deposition step.

25 Claims, 4 Drawing Sheets

PARTICLE REDUCTION IN PECVD PROCESSES FOR DEPOSITING LOW-K MATERIAL BY USING A PLASMA ASSISTED POST-DEPOSITION STEP

BACKGROUND OF THE INVENTION

1. Field of the Invention

Generally, the present disclosure relates to the fabrication of integrated circuits, and, more particularly, to the formation of dielectric material layers of reduced permittivity.

2. Description of the Related Art

Semiconductor devices and any other microstructures are typically formed on substantially disc-shaped substrates made of any appropriate material. The majority of semiconductor devices including highly complex electronic circuits are currently, and in the foreseeable future will be, manufactured on the basis of silicon due to the virtually unlimited availability of silicon, thereby rendering silicon substrates and silicon-containing substrates, such as silicon-on-insulator (SOI) substrates, viable carriers for forming semiconductor devices, such as microprocessors, SRAMs, ASICs (application specific ICs) and the like. The individual integrated circuits are arranged in an array, wherein most of the manufacturing steps, which may involve several hundred individual process steps in sophisticated integrated circuits, are performed simultaneously for all chip areas on the substrate, except for photolithography processes, metrology processes and packaging of the individual devices after dicing the substrate. Thus, economical constraints drive semiconductor manufacturers to steadily increase the substrate dimensions, thereby also increasing the area available for producing actual semiconductor devices and thus increasing production yield. On the other hand, device dimensions are continuously reduced in view of performance criteria, as, typically, reduced transistor dimensions provide an increased operating speed.

In modern integrated circuits, the circuit elements are formed in and on a semiconductor layer, while most of the electrical connections are established in one or more "wiring" layers, also referred to as metallization layers, wherein the electrical characteristics, such as resistivity, electromigration, signal propagation delay, etc., of the metallization layers significantly affect the overall performance of the integrated circuit. Due to the ongoing demand for shrinking the feature sizes of highly sophisticated semiconductor devices, copper, in combination with a low-k dielectric material, has become a frequently used alternative in the formation of so-called wiring structures comprising metallization layers having metal line layers and intermediate via layers. Metal lines act as intra-layer connections and vias act as inter-layer connections, which commonly connect individual circuit elements to provide the required functionality of the integrated circuit. Typically, a plurality of metal line layers and via layers stacked on top of each other are necessary to realize the connections between all internal circuit elements and I/O (input/output), power and ground pads of the circuit design under consideration.

For extremely scaled integrated circuits, the signal propagation delay is no longer limited by the circuit elements, for instance by field effect transistors, but is limited, owing to the increased density of circuit elements, which requires an even more increased number of electrical connections for mutually connecting these circuit elements, by the close proximity of the metal lines, since the line-to-line capacitance increases as the spacing decreases. For example, in presently available devices produced by volume production techniques, the distance of neighboring metal lines may be 100 nm and less in some metallization levels. This fact, in combination with a reduced conductivity of the lines due to a reduced cross-sectional area, results in increased resistance capacitance (RC) time constants. For this reason, traditional dielectrics, such as silicon dioxide (k>4) and silicon nitride (k>6-7) are increasingly replaced in metallization layers by dielectric materials having a lower permittivity, which are therefore also referred to as low-k dielectrics having a relative permittivity of approximately 3 or less.

However, in very advanced semiconductor devices with reduced distances between neighboring metal lines, such as the 45 nm technology node, the resulting parasitic RC time constants may still be considered inappropriate, thereby requiring even lower values for a dielectric constant of the inter metal dielectric material. For this purpose, the dielectric constant may further be reduced to values of 2.7 and less, which may also be referred to as ultra low-k (ULK) materials. Thus, great efforts have been made in developing materials and corresponding manufacturing techniques usable in high volume production. For this purpose, a plurality of spin-on processes, in combination with corresponding polymer materials, may frequently be used, while, in other approaches, plasma enhanced chemical vapor deposition (CVD) techniques are considered as promising candidates for providing low-k dielectric materials. For example, in some approaches, the basic dielectric constant of a plurality of CVD deposited low-k dielectric materials may further be reduced by reducing the material density, which may frequently be accomplished by incorporating so-called porogens, i.e., organic materials including methyl groups that may be removed, at least partially, after the deposition so as to produce a porous dielectric material having the desired reduced dielectric constant. For example, a plurality of process techniques have been established in which hydrogen-containing organic silicon materials may be provided to act as a basic low-k dielectric material and thus as a backbone for ULK materials, while, additionally, appropriate precursor species may be incorporated into the deposition ambient during the plasma enhanced CVD process, which may thus be incorporated into the basic low-k dielectric material. After deposition of the low-k dielectric material, a further treatment, such as radiation by ultraviolet light, may be performed to specifically break up chemical bonds of the porogens and to cause out-diffusion of the corresponding modified molecules, thereby generating respective nano voids in the basic low-k dielectric material. Although the deposition of low-k dielectric materials, which may have per se a very low dielectric constant or which may be converted in ultra low-k materials by subsequent treatment, by means of plasma enhanced CVD techniques presents a very promising approach for sophisticated semiconductor devices, it turns out, however, that, in addition to general issues related to dielectric materials of reduced permittivity, such as reduced mechanical stability and the like, deposition-related failures may be observed which may not be compatible with defect criteria of semiconductor devices having critical dimensions of 50 nm and less, as will be described in more detail with reference to FIGS. 1a-1b.

FIG. 1a schematically illustrates a cross-sectional view of a semiconductor device 100 which comprises a substrate 101, which may include any circuit elements, such as transistor elements, capacitors and the like. For convenience, these circuit elements are not shown. The substrate 101 may represent a bulk silicon substrate or an SOI substrate, since, typically, complex integrated circuits produced by volume production techniques may be formed on the basis of a silicon material, as previously explained. Furthermore, a dielectric layer 102, which may be comprised, at least partially, of a low-k material or any other dielectric material, may be formed above the substrate 101, which may represent a portion of a metallization level or a contact structure of the semiconductor device 100. For example, a metal region 103 is formed within the dielectric layer 102 and may represent any highly conductive device area, such as a contact area of a circuit element or a metal region of a metallization layer. The metal region 103 may be separated from the material of the dielectric layer 102 by a barrier layer 104, which is typically provided as a layer for reducing the diffusion of metal atoms into the dielectric material 102 and also to reduce the diffusion of atoms from the dielectric layer 102 into the metal region 103. Furthermore, the barrier layer 104 may also enhance the adhesion of the metal to the dielectric material. In sophisticated devices, the metal region 103 may comprise copper and the barrier layer 104 may be comprised of one or more layers including tantalum, tantalum nitride, titanium, titanium nitride and the like. Moreover, frequently, a dielectric barrier layer or cap layer 105 comprised of a dielectric material that substantially prevents diffusion of metal atoms of the metal region 103 into neighboring dielectric areas is provided, while in other cases, in addition to or alternatively, the layer 105 may have etch stop capabilities during the patterning of a further dielectric layer 106, which may represent a layer of dielectric material having a desired reduced dielectric constant, as described above. For example, the dielectric barrier or cap layer 105 may comprise silicon nitride, silicon carbide, nitrogen-containing silicon carbide and the like, which may efficiently reduce copper diffusion and which may also provide enhanced mechanical integrity and provide the desired etch stop capabilities. It should be appreciated that additional dielectric materials may also be provided between the dielectric layer 102 and layer 106, which may be comprised of a mixture of silicon, oxygen, hydrogen and carbon, possibly in combination with a porogen 107 which may have to be removed, at least partially, at a later manufacturing stage, as discussed above. For example, appropriate "transition" layers may be provided to enhance the adhesion of the dielectric layer 106 to the lower lying device level, if materials of a dielectric constant of 2.5 and less are considered.

A typical process flow for forming the semiconductor device 100 as shown in FIG. 1a may comprise the following processes. After forming the basic structures of any circuit elements in and above the substrate 101, the dielectric layer 102 and the metal region 103 with a conductive barrier layer 104 may be formed by well-established process techniques. Next, the dielectric barrier or cap layer 105 may be deposited, for instance by plasma enhanced CVD on the basis of well-established process recipes so as to form, for instance, a nitrogen-enriched silicon carbide layer and the like. Thereafter, the dielectric layer 106 may be deposited by a plasma enhanced CVD deposition process 108, in which a plasma ambient may be established by applying an appropriate high-frequency power, i.e., by applying electromagnetic power with a frequency of 10-15 MHz, typically approximately 13 MHz, which may be capacitively or inductively coupled into the plasma ambient. For this purpose, well-established deposition tools are available in which an appropriate plasma may be generated. During the deposition process 108, an appropriate pressure may be adjusted and appropriate precursor gases, such as trimethylsilane (3MS) or tetramethylsilane (4MS), in combination with additional carrier gases, may be supplied to the deposition ambient 108. For instance, nitrogen, ammonium and the like may frequently be used in combination with other specified precursor species so as to form a silicon, carbon and hydrogen-containing material. As previously explained, in the deposition phase of the process 108, an appropriate precursor species for incorporating the porogen 107 may be supplied, if required. A specific set of process parameters for the deposition phase of the process 108 may readily be established by experiment and may depend on the characteristics of material of the layer 106, for instance with respect to the desired value of the dielectric constant, mechanical characteristics, such as hardness and the like. The deposition phase of the process 108 may be stopped by turning off the high frequency power for maintaining the plasma in the ambient 108 and by discontinuing the supply of the corresponding precursor gases. In this manner, a desired thickness of the layer 106 may be provided for a given deposition rate during the deposition phase of the process 108. Thereafter, residues of the precursor species may be removed from the ambient 108 and finally a purge step may be performed, for instance at the pressure of 3-10 Torr on the basis of appropriate inert gases, which are to be understood as gases which may not chemically react with exposed surface areas of the material 106. For instance, nitrogen may be considered as an inert gas for the above-specified low-k dielectric material.

As previously explained, depending on whether the corresponding porogen species has been incorporated in the layer 106, further treatment may be performed, typically on the basis of ultraviolet radiation so as to reconfigure the structure of the layer 106, i.e., to reduce the overall material density by creating nano voids and the like. For this purpose, the frequency of the ultraviolet radiation may specifically be selected so as to destroy bonds of the porogen material 107, thereby enhancing volatility of the corresponding components, which may then diffuse out of basic materials, thereby creating nano voids and the like. In other cases, a sufficiently low value for the dielectric constant may be obtained without providing the porogen material 107 on the basis of an appropriate composition of precursor materials. For instance, a dielectric constant of 2.7 and less may be obtained for silicon, oxygen and carbon-containing dielectric materials, which may be formed on the basis of the plasma enhanced CVD process 108.

After the deposition of the low-k dielectric material 106, a plurality of surface defects in the form of particles may be observed, wherein the large number of the corresponding particles may not be compatible with the defect control requirements of sophisticated technology flows, since excessive chemical cleaning of the layer 106 may result in additional damage to exposed surface portions of the layer 106, while less efficient and thus less aggressive cleaning processes may result in an unacceptable defect density.

FIG. 1b schematically illustrates a top view of the substrate 101 and formed thereon the layer 106 as obtained by the plasma enhanced deposition process 108, wherein a typical distribution of unwanted particles is illustrated. As shown, areas of increased particle density 106A may extend across significant surface areas of the layer 106, thereby requiring efficient post-deposition cleaning recipes which, however, may result in a certain degree of surface damage in the layer 106, thereby resulting in reduced performance and reliability of the metallization system of the semiconductor device 100.

Consequently, although plasma enhanced CVD techniques may represent promising techniques for forming low-k dielectric materials and ultra low-k dielectric materials, the high defect rate observed after the deposition may not be compatible with defect control requirements of advanced technology nodes or may result in reduced performance and reliability of respective metallization structures.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques for forming sophisticated low-k dielectric materials on the basis of plasma enhanced chemical vapor deposition (PECVD) processes, wherein a significantly reduced defect rate may be obtained after the deposition of the low-k dielectric material. Without intending restriction of the present application to the following explanation, it is assumed that the presence of reactive species in the deposition ambient after discontinuing the plasma have significant influence on the creation of corresponding particles. According to the principles disclosed herein, it is contemplated to reduce exposure to reactive components after discontinuing the supply of the material of specific precursor species by establishing an inert plasma ambient, thereby reducing the effect of any reactive components that may still be present in the ambient prior to essentially completely removing the precursor species after the deposition phase. An inert plasma ambient is to be understood as an ambient in which a plasma may be established on the basis of gaseous components, which may not result in a chemical reaction with the dielectric material deposited during the preceding deposition phase. Consequently, by implementing an additional inert plasma treatment after the actual plasma enhanced deposition process, enhanced surface conditions may be provided for the low-k dielectric material, thereby enabling application of well-established PECVD low-k dielectric materials for sophisticated semiconductor devices requiring metallization systems with interlayer dielectric materials of a dielectric constant of 2.7 and significantly less.

One illustrative method disclosed herein comprises establishing a plasma ambient comprising one or more precursor species and one or more carrier gases. The method comprises exposing a deposition surface formed above a substrate to the plasma ambient so as to deposit a dielectric material layer on the deposition surface on the basis of the one or more precursor species, wherein the dielectric material layer has a dielectric constant of approximately 3.0 or less. Furthermore, the supply of the one or more precursor species to the plasma ambient is discontinued and one or more inert species are supplied to the plasma ambient to create an inert plasma ambient. Finally, the dielectric material layer is exposed to the inert plasma ambient.

A further illustrative method disclosed herein comprises depositing a low-k dielectric material above a substrate of a semiconductor device by establishing a plasma in a gaseous deposition ambient. Furthermore, the low-k dielectric material is exposed to an inert plasma ambient.

A still further illustrative method disclosed herein comprises forming a low-k dielectric material layer of a metallization system of a semiconductor device by performing a deposition phase of a plasma enhanced chemical vapor deposition process. The method additionally comprises exposing the low-k dielectric material to an inert plasma ambient in a post-deposition phase of the plasma enhanced deposition process.

BRIEF DESCRIPTION OF THE DRAWINGS

The disclosure may be understood by reference to the following description taken in conjunction with the accompanying drawings, in which like reference numerals identify like elements, and in which.

Figure 1A:
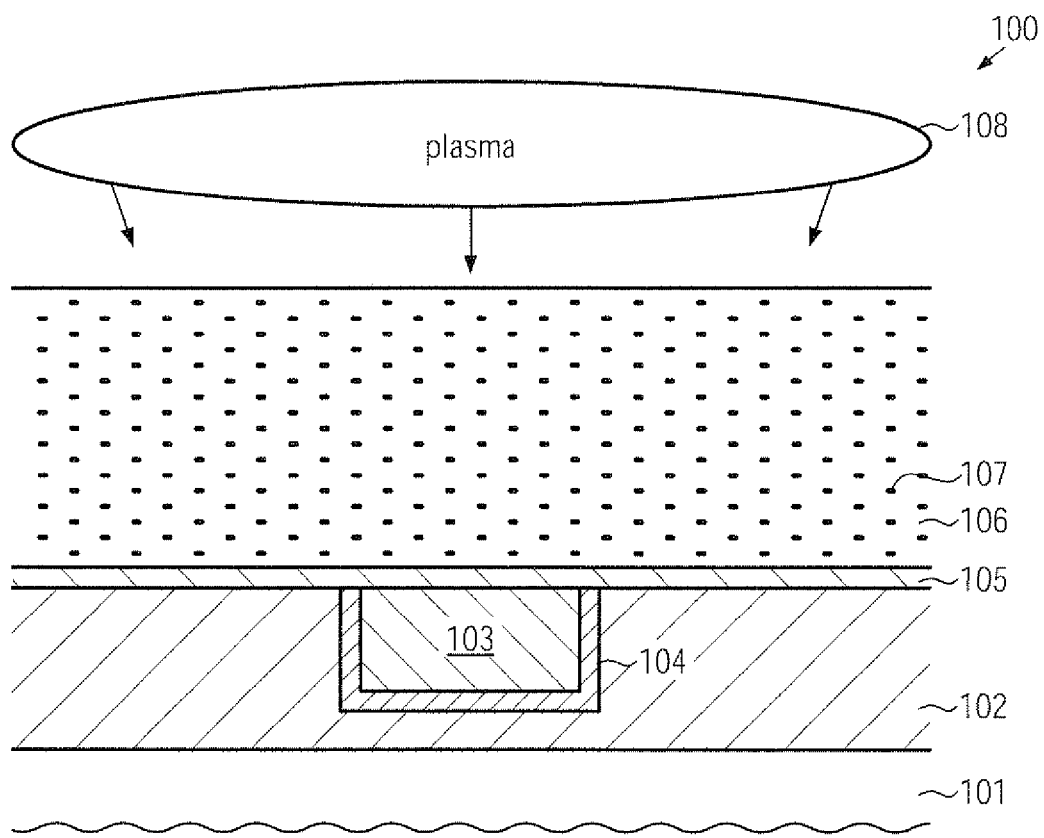
FIG. 1a schematically illustrates a cross-sectional view of a semiconductor device during a manufacturing stage in depositing a low-k dielectric material on the basis of a plasma enhanced deposition process, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the principles disclosed herein contemplate enhanced PECVD techniques for the deposition of low-k dielectric materials, which may have a dielectric constant of 3.0 and less, for instance 2.7 and less, wherein the dielectric constant may even further be reduced on the basis of appropriate treatments, such as UV radiation and the like, after the deposition of the low-k dielectric base material. In order to reduce the overall defect rate observed in conventional PECVD strategies, exposure of the surface as deposited to possible reactive components is taken into consideration in that a plasma may be maintained during the critical phase of discontinuing the supply of the precursor material. Thus, plasma is not tuned off immediately after the actual deposition, as is typically the case in conventional strategies, but an appropriate plasma ambient may be maintained which may be accomplished on the basis of inert gases, thereby significantly reducing possible interaction of any reactive components with the exposed surface area of the material deposited. Thus, the probability of creating unwanted particles on the surface of the low-k dielectric material may be reduced, thereby significantly relaxing any constraints with respect to subsequent cleaning processes or other subsequent process steps for adjusting the overall material characteristics of the low-k base material or for patterning the same so as to form metal lines therein. Thus, in some illustrative embodiments, immediately after the deposition phase, which may be stopped by discontinuing the precursor species, the plasma may be maintained, possibly with different parameter values compared to the previous deposition step, such as with respect to high frequency power and the like, while additionally one or more inert gas species may be supplied to the ambient which, in addition to the plasma, reduces the probability of any interaction with exposed surfaces while also promoting removal of any reactive components which may still be present in the ambient. Thereafter, the plasma may be turned off and a purge step may be performed to complete the overall plasma enhanced deposition process.

With reference to FIGS. 2a-2e, further illustrative embodiments will now be described in more detail, while reference may also be made to FIGS. 1a-1b if appropriate.

Figure 2A:
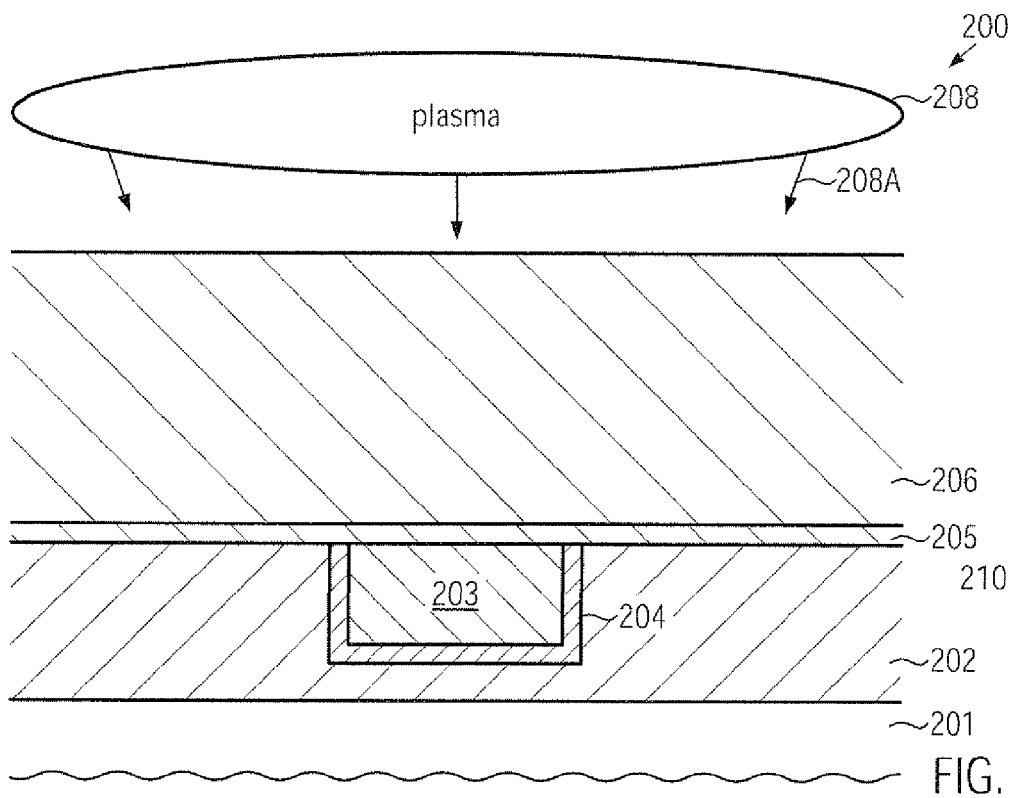
FIGS. 2a-2b schematically illustrate a semiconductor device during various phases of a plasma enhanced deposition process in forming a low-k dielectric material wherein an inert plasma ambient may be established after the deposition phase, according to illustrative embodiments.

FIG. 2a schematically illustrates the semiconductor device 200 comprising a substrate 201, in and above which may be formed microstructural features, such as circuit elements of complex integrated circuits in the form of transistors, capacitors, resistors and the like. These circuit elements or microstructural features may be provided in one or more device levels, wherein, for convenience, a device level 210 may be illustrated in FIG. 2a. It should be appreciated that the device level 210 may thus represent a semiconductor material containing, for instance, silicon and the like, in and above which semiconductor elements, such as transistors, diodes and the like, may be formed. In other cases, the device level 210 may represent an appropriate contact structure connecting to respective circuit elements (not shown) which may be provided in a lower lying device level. In still other illustrative embodiments, the device level 210 may represent a metallization layer of a metallization system of the device 200, above which a further metallization layer is to be formed that may comprise a low-k dielectric material. For example, the device level 210 may comprise a dielectric material 202 which may be provided in the form of a conventional dielectric material or a low-k dielectric material having a dielectric constant of 3.0 or less. Furthermore, a circuit feature 203 may be provided in the level 210, for instance in the form of a metal region, which may include a conductive barrier material 204, when a direct contact of a highly conductive metal, such as copper and the like, with the dielectric material 202 is considered inappropriate. Furthermore, the device level 210 may comprise a dielectric layer 205, for instance in the form of silicon nitride, silicon carbide, nitrogen-containing silicon carbide, silicon dioxide and the like or a specific combination of two or more of these materials. Furthermore, a low-k dielectric layer 206 may be formed above the device layer 210, which may also be referred to as a deposition surface for the dielectric material 206. Thus, the device layer 210, for instance the dielectric material 205, represents a material on which a low-k dielectric material 206 may be deposited on the basis of a plasma enhanced deposition process. The semiconductor device 200 may be formed in accordance with established process techniques, wherein the device layer 210 may be formed in accordance with the corresponding design rules which may, for instance, require formation of circuit elements, such as the element 203, with critical dimensions of 50 nm and less, when respective dimensions of transistor elements are considered. When the feature 203 may represent a metal line, a width may be 100 nm and less. After completing the device level 210, i.e., after depositing the dielectric layer 205, the device 200 may be subjected to a plasma enhanced deposition process 208. The process 208 may comprise a deposition phase 208A during which plasma may be established, while also appropriate precursor species may be supplied. For this purpose, any available deposition tools, which may enable the creation of an appropriate plasma, may be used. For instance, a plurality of PECVD tools for 200 mm substrates, 300 mm substrates, even 450 mm substrates are available in the art and may be used for the process 208. In some illustrative embodiments, well-established precursor materials, such as 3MS, 4MS, in combination with ammonium and the like, may be used to form the low-k dielectric material 206 in the form of a silicon, oxygen, carbon and/or hydrogen-containing material. As previously explained, k values of 3.0-2.6 may be achieved by adding these precursor species and also adjusting other process parameters, such as plasma power, pressure, temperature, gas flow rates and of liquids, if precursor species in the form of liquids are used, and the like. In other cases, depending on the desired material characteristics, additional components, such as porogens and the like, may be supplied to the ambient 208A on the basis of well-established recipes. Thus, after establishing an atmosphere, high frequency power may be supplied to ignite a plasma and maintain the same during the deposition phase

208A. Consequently, a desired thickness of the material 206 may be deposited during the phase 208A.

Figure 2B:
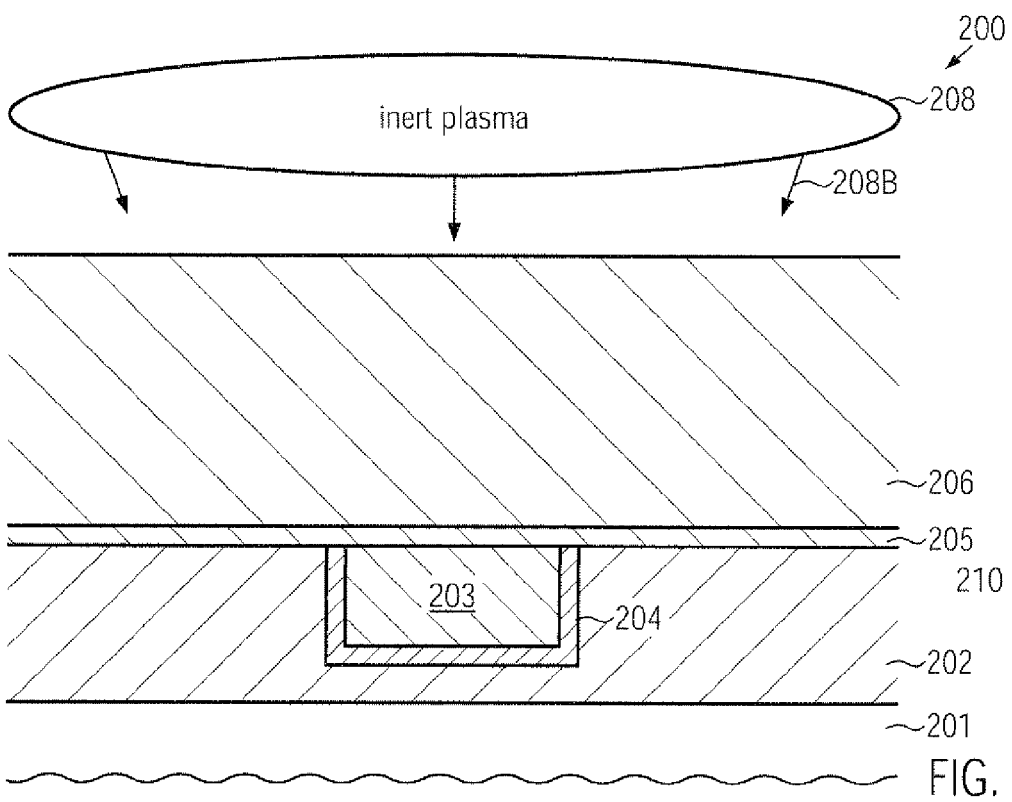

FIG. 2*b* schematically illustrates the semiconductor device 200 during a further phase 208B of the PECVD process 208. As illustrated, immediately after the deposition phase 208A (FIG. 2*a*), an inert plasma may be established in the phase 208B, which may be accomplished by supplying high frequency power, which, in some illustrative embodiments, may be achieved without interrupting supply of high frequency power between the deposition phase 208A and the inert plasma phase 208B. For instance, after discontinuing the supply of precursor species during the phase 208A, the supply of high frequency power may be adjusted to an appropriate value, which may be equal to or may differ from the value as used during the deposition phase 208A, depending on the process parameters required for actually depositing the dielectric material 206. In some illustrative embodiments, the plasma power applied during the inert plasma phase 208B may range from approximately 100-700 W, for instance approximately 150 W, when processing the substrate 201 having a diameter of 300 mm. In this case, a high frequency power of approximately 0.15-1.0 W per $cm^2$ with respect to the substrate 201 may be used for establishing the plasma during the phase 208B. Furthermore, a pressure during the phase 208B may be adjusted to approximately 3-10 Torr, wherein, in one illustrative embodiment, approximately 7.5 Torr may be used. Furthermore, the inert nature of the inert plasma ambient during the phase 208B may be achieved by supplying appropriate gases, which may not result in a chemical reaction with the surface of the layer 206. That is, depending on the material characteristics of the layer 206, the term "inert" may characterize different gases, wherein, for a plurality of low-k dielectric materials, for instance based on silicon, oxygen, carbon and the like, the following gas components may be used as inert species. For instance, nitrogen, ammonium, hydrogen, nitrogen oxide may be used as inert species, while in other cases, in addition to or alternatively to these gases, one or more noble gases may be used. Typically, these gases may be supplied with flow rates of approximately 100-10,000 sccm (standard cubic centimeter per minute) so as to obtain the desired pressure for a plurality of standard deposition tools. In other cases, based on the above technical teaching, any other appropriate flow rates may be determined with respect to a specific deposition tool.

It is believed that maintaining a plasma during the phase 208B in combination with providing an inert gaseous ambient may significantly reduce the probability of an interaction of any reactive components that may still be present in the process chamber after stopping the actual deposition phase. Consequently, a significant reduction of particles may be observed.

Figure 2C:
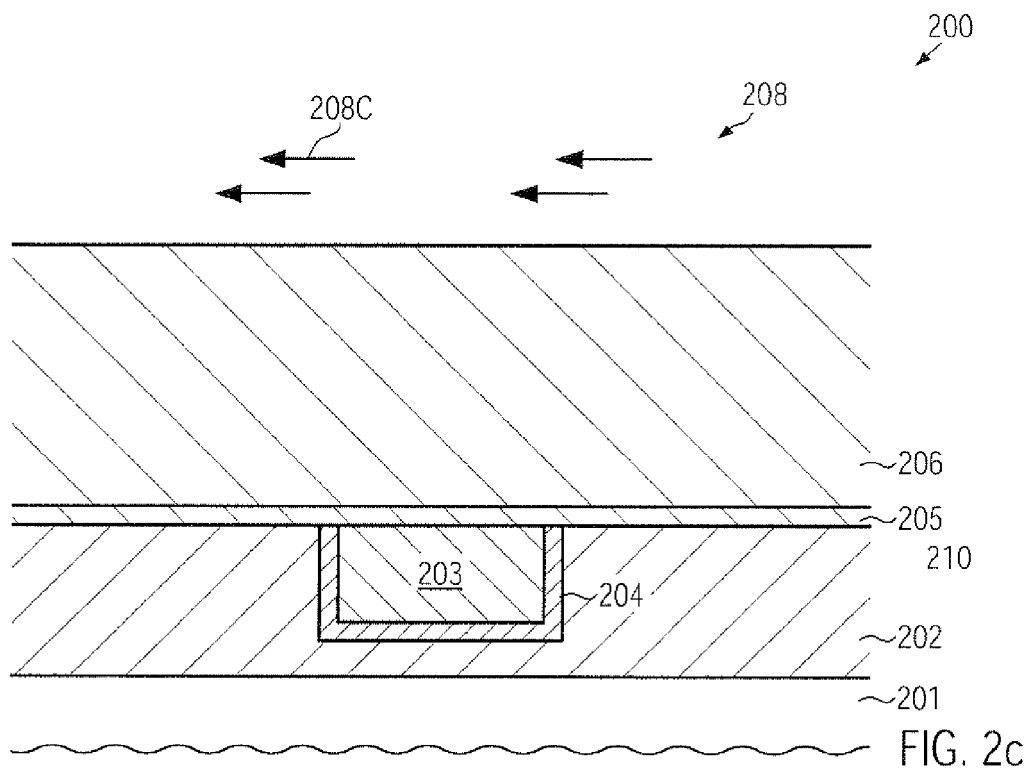
FIG. 2c illustrates the semiconductor device during a purge step of the plasma enhanced deposition process.

FIG. 2*c* schematically illustrates the device 200 in a further phase 208C of the PECVD process according to illustrative embodiments, wherein the phase 208C may represent a purge step which may be performed in the absence of any plasma. For instance, appropriate gases, such as noble gases or any other inert species, may be supplied while discontinuing the supply of high frequency power, thereby further removing any unwanted gas components, while the previous phase 208B may result in a reduced probability of creating additional surface defects. For instance, a pressure of 3-10 Torr may be used, while flow rates of approximately 100-10,000 sccm for a plurality of deposition tools may be appropriate for any carrier gases and inert gases used during the purge phase 208C. In some illustrative embodiments, the gas flow rates and the pressure may be maintained throughout the phases 208B, 208C, and the supply of high frequency power may be discontinued at any appropriate time during the phase 208B. In other cases, upon discontinuing the high frequency power so as to end the phase 208B or at any time after the discontinuation of the high frequency power, appropriate pressure and flow rates may be established in the phase 208C. For instance, the overall cycle time of the process 208 may depend on the deposition parameters during the phase 208A so as to obtain a desired layer thickness, while inserting the inert plasma phase 208B with a duration of approximately 2-60 seconds may not unduly contribute to a cycle time since enhanced defect rates may provide enhanced process efficiency during the subsequent processing of the device 200. In other cases, the purge phase 208C may be reduced compared to conventional strategies due to the preceding inert plasma phase 208B, thereby maintaining the increased cycle time for process 208 at an acceptable level. It should be appreciated that the substrate temperature may typically be maintained substantially constant during the entire deposition process 208 and may be selected so as to correspond to the deposition conditions during the deposition phase 208A.

Thus, by providing the inert plasma phase 208B, enhanced surface conditions may be obtained.

Figure 1B:
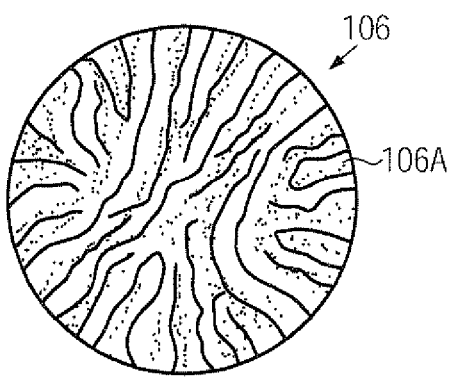
FIG. 1b schematically illustrates a top view of the low-k dielectric material layer, wherein a moderately high particle density may be observed.
Figure 2D:
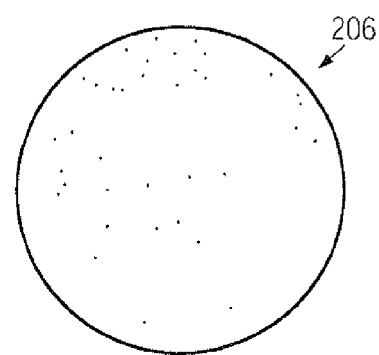
FIG. 2d schematically illustrates a top view of the low-k dielectric material layer after the PECVD process, wherein a reduced defect rate may be observed for a basic material composition of the low-k dielectric material that is substantially the same as used for the low-k dielectric material formed in accordance with FIGS. 1a-1b.

FIG. 2*d* schematically illustrates a top view of the low-k dielectric layer 206 after the deposition process 208, wherein, during the deposition phase, the same parameters may have been used as are also used for forming the layer 106 as shown in FIGS. 1*a*-1*b*. As is clearly evident from FIGS. 2*d* and 1*b*, a significant reduction of the defect rate may be obtained. Consequently, the further processing of the device 200 may be based on less aggressive cleaning recipes and/or enhanced surface conditions for the further patterning of the layer 206.

Figure 2E:
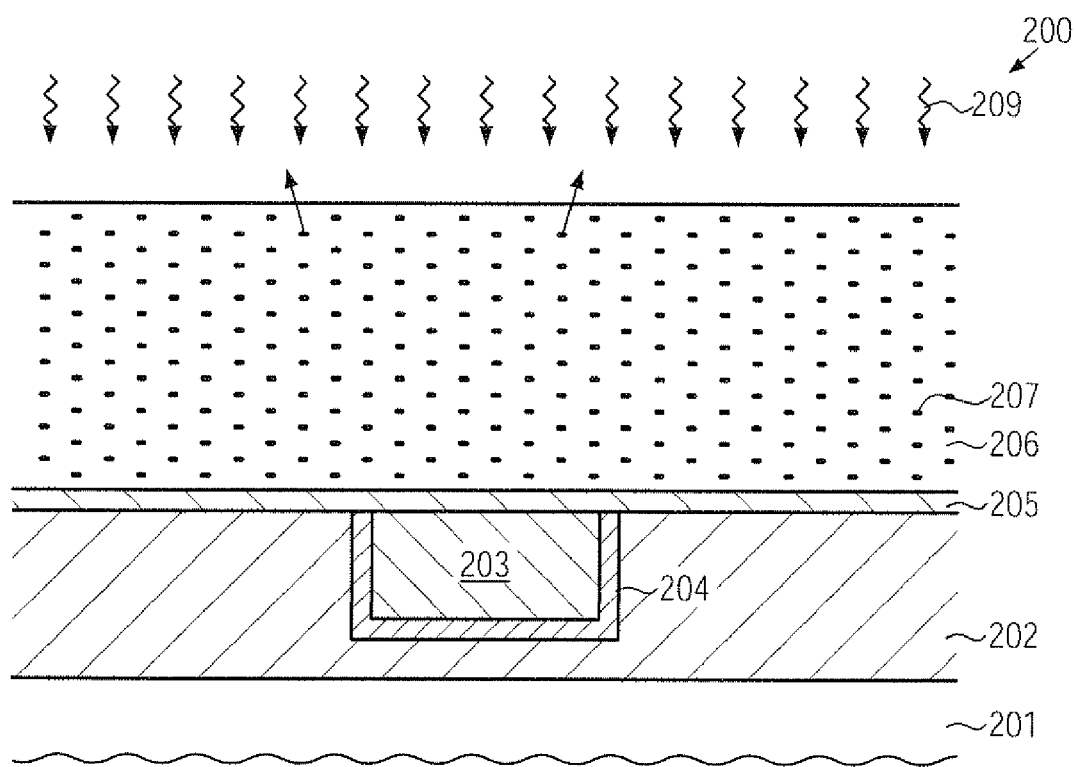
FIG. 2e schematically illustrates the semiconductor device according to further illustrative embodiments in which a porogen material may be incorporated during the plasma enhanced deposition process, which may be removed by a UV treatment, according to further illustrative embodiments.

FIG. 2*e* schematically illustrates the device 200 wherein the low-k dielectric material 206 may be provided so as to contain a porogen material 207, which may also be incorporated during the deposition phase 208A (FIG. 2*a*) by providing an appropriate precursor species, for which well-established recipes are available. Furthermore, the device 200 may be subjected to a treatment 209 for further reducing the dielectric constant of the layer 206, which may be accomplished by a UV treatment, while the substrate temperature may also be increased in order to promote out-gassing of volatile components, which may be created during the treatment 209. Also, in this case, the reduced defect rate may provide enhanced process conditions during the treatment 209, since less aggressive cleaning recipes may be used prior to the treatment 209, thereby providing more uniform material characteristics upon initiating out-diffusion of volatile species of the porogens 207. Consequently, material characteristics of the layer 206 with respect to dielectric constant, hardness and the like may be adjusted with enhanced uniformity due to the superior surface characteristics of the deposition process 208.

Figure 2F:
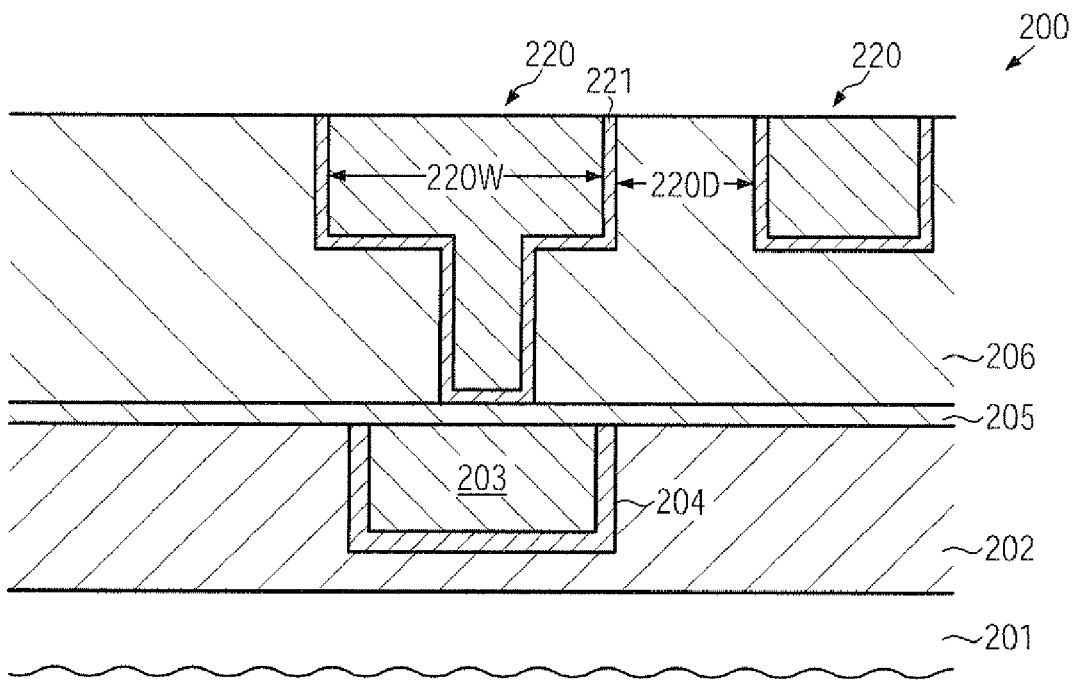
FIG. 2f schematically illustrates the semiconductor device in a further advanced manufacturing stage, in which a plurality of closely spaced metal lines may be formed in the low-k dielectric material, wherein the patterning process may be performed on the basis of improved surface conditions compared to conventional strategies.

FIG. 2*f* schematically illustrates the semiconductor device 200 in a further advanced manufacturing stage according to further illustrative embodiments. As illustrated, a plurality of metal lines 220 may be formed in the dielectric material 206. The metal lines 220 may comprise an appropriate metal, such as copper, copper alloys and the like, possibly in combination with a conductive barrier material 221 in order to reduce an interaction of the highly conductive metal with the low-k dielectric material of the layer 206. The metal lines 220 may have critical dimensions, i.e., a width 220W, corresponding to the design rules of the technology standard under consideration, wherein a corresponding width may be 100 nm and less. Similarly, a distance 220D between adjacent two of the metal lines 220 may be selected in accordance with design rules and may be 100 nm and less, such as 60 nm and less in highly sophisticated semiconductor devices according to the 45 nm technology node. In this case, the dielectric constant of the material 206 may be selected to be 2.5 and less, wherein the reduced defect rate obtained by the deposition process 208 may enable appropriate process strategies for forming the metal lines 220 so as to have the required minimal critical dimensions. That is, the cleaning, providing of etch masks in combination with hard mask materials and the like may be performed on the basis of enhanced surface condition of the layer 206, which may additionally have moderately uniform material characteristics with respect to hardness and dielectric constant, as previously explained, thereby enhancing the overall patterning regime for forming respective openings in the layer 206. Thereafter, the barrier material 221, in combination with a desired metal, such as copper, may be filled into the corresponding openings by well-established process techniques.

As a result, the present disclosure provides techniques for forming low-k dielectric materials and ULK materials on the basis of plasma enhanced CVD processes, wherein the creation of particles on the surface of the deposited layer may be significantly reduced by implementing an inert plasma step after the actual deposition of the low-k dielectric material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   establishing a plasma ambient comprising one or more precursor species and one or more carrier gases;
   exposing a deposition surface formed above a substrate to said plasma ambient so as to deposit a dielectric material layer on said deposition surface on the basis of said one or more precursor species, said dielectric material layer having a dielectric constant of approximately 3.0 or less;
   discontinuing the supply of said one or more precursor species to said plasma ambient;
   supplying one or more inert species to said plasma ambient to create an inert plasma ambient; and
   exposing said dielectric material layer to said inert plasma ambient without interrupting plasma power provided to generate said plasma ambient between the depositing of said dielectric material and creating said inert plasma ambient.

2. The method of claim 1, further comprising purging said dielectric material layer after exposure to said inert plasma ambient.

3. The method of claim 1, wherein a pressure in said inert plasma ambient is in the range of approximately 3-10 Torr.

4. The method of claim 1, wherein a plasma in said inert plasma ambient is established by a high frequency power with a power density in the range of approximately 0.14-1 W per $cm^2$.

5. The method of claim 4, wherein said power density is in the range of approximately 0.2-0.3 W per $cm^2$.

6. The method of claim 1, further comprising exposing said dielectric material layer to ultraviolet radiation so as to reduce said dielectric constant.

7. The method of claim 1, wherein said one or more precursor species comprise silicon, oxygen, carbon and hydrogen.

8. The method of claim 1, further comprising forming metal lines in said dielectric material layer, wherein two adjacent ones of said metal lines have a distance of approximately 100 nm or less.

9. The method of claim 1, wherein said dielectric material layer is exposed to said inert plasma ambient for approximately 2-60 seconds.

10. The method of claim 1, wherein depositing said dielectric material layer in said plasma ambient and exposing said dielectric material layer to said inert plasma ambient are accomplished without performing a substrate transport activity.

11. The method of claim 1, wherein said one or more inert species are supplied in the form of one or more noble gases.

12. The method of claim 1, wherein said one or more inert species comprise at least one of a noble gas, nitrogen, ammonium and hydrogen.

13. A method, comprising:
   depositing a low-k dielectric material above a substrate of a semiconductor device by establishing a plasma in a gaseous deposition ambient; and
   exposing said low-k dielectric material to an inert plasma ambient without an interrupting plasma power provided to generate said plasma between the depositing of said low-k dielectric material and exposing said low-k dielectric material to said inert plasma ambient.

14. The method of claim 13, wherein said inert plasma ambient is established by discontinuing supply of precursor materials to said deposition ambient and supplying one or more noble gases to said deposition ambient.

15. The method of claim 13, wherein said inert plasma ambient is established by discontinuing supply of precursor materials to said deposition ambient and supplying at least one of a noble gas, nitrogen, ammonium and hydrogen to said deposition ambient.

16. The method of claim 13, wherein a pressure in said inert plasma ambient is set to approximately 3-10 Torr.

17. The method of claim 13, wherein a high frequency power for maintaining a plasma in said inert plasma ambient is in the range of approximately 100-700 W for a substrate size of approximately 300 mm.

18. The method of claim 13, wherein a dielectric constant of said low-k dielectric material layer as deposited is 2.7 or less.

19. A method, comprising:
   forming a low-k dielectric material layer of a metallization system of a semiconductor device by performing a deposition phase of a plasma enhanced chemical vapor deposition process, wherein plasma power is provided to establish a plasma ambient for said deposition phase; and
   exposing said low-k dielectric material layer to an inert plasma ambient in a post-deposition phase of said plasma enhanced deposition process without interrupting said plasma power.

20. The method of claim 19, wherein a dielectric constant of said low-k dielectric material layer is 2.7 or less.

21. The method of claim 19, wherein said inert plasma ambient is established by using at least one of a noble gas, nitrogen, hydrogen and ammonium.

22. The method of claim 19, wherein a pressure in said inert plasma ambient is in the range of approximately 3-10 Torr.

23. The method of claim 19, further comprising performing a purge phase of said plasma enhanced chemical vapor deposition process in the absence of a plasma.

24. The method of claim 23, wherein a pressure during said purge phase is in the range of approximately 3-10 Torr.

25. The method of claim 19, further comprising forming metal lines in said low-k dielectric material layer, wherein a distance between at least two adjacent metal lines is approximately 100 nm or less.

* * * * *